(12) United States Patent (10) Patent No.: US 7,675,752 B2
Hongo (45) Date of Patent: Mar. 9, 2010

(54) ELECTRONIC APPARATUS

(75) Inventor: Takeshi Hongo, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/356,413

(22) Filed: Jan. 20, 2009

(65) Prior Publication Data

US 2009/0195988 A1 Aug. 6, 2009

(30) Foreign Application Priority Data

Jan. 31, 2008 (JP) ............... 2008-020945

(51) Int. Cl.
*H05K 7/20* (2006.01)
*F28D 15/00* (2006.01)
(52) U.S. Cl. .................. 361/700; 165/121; 165/140.33; 361/679.52; 361/694; 361/695; 361/703
(58) Field of Classification Search ............ 165/104.33; 361/679.47, 679.48, 679.52, 700
See application file for complete search history.

(56) References Cited

U.S. PATENT DOCUMENTS

| 2,330,632 | A * | 9/1943 | Seligman | 165/86 |
| 7,212,404 | B2 * | 5/2007 | Wang et al | 361/697 |
| 7,474,526 | B2 * | 1/2009 | Fujiwara | 165/104.21 |
| 2006/0157724 | A1 * | 7/2006 | Fujita | 257/99 |
| 2007/0133174 | A1 * | 6/2007 | Mikami et al. | 361/700 |
| 2008/0093056 | A1 * | 4/2008 | Hwang et al. | 165/104.33 |
| 2009/0073655 | A1 * | 3/2009 | Takakusaki et al. | 361/696 |
| 2009/0103262 | A1 * | 4/2009 | Hata | 361/689 |
| 2009/0129020 | A1 * | 5/2009 | Fujiwara | 361/697 |
| 2009/0145588 | A1 * | 6/2009 | Liu | 165/151 |
| 2009/0154103 | A1 * | 6/2009 | Liu | 361/700 |
| 2009/0168331 | A1 * | 7/2009 | Fujiwara | 361/679.47 |
| 2009/0229791 | A1 * | 9/2009 | Hung et al. | 165/80.3 |

FOREIGN PATENT DOCUMENTS

| JP | 07-190655 | 7/1995 |
| JP | H08-37259 A | 2/1996 |
| JP | 09-210583 | 8/1997 |
| JP | 2000-161880 | 6/2000 |
| JP | 2003-531480 | 10/2002 |

(Continued)

OTHER PUBLICATIONS

An English translation of Notice of Reasons for Rejection mailed by Japan Patent Office for Japanese Patent Application No. 2008-20945 on Apr. 14, 2009.

(Continued)

*Primary Examiner*—Gregory D Thompson
(74) *Attorney, Agent, or Firm*—Knobbe, Martens, Olson & Bear LLP

(57) ABSTRACT

According to one embodiment, a heat sink includes first and second fin units. Fins of the first fin unit are provided with a through-hole part in which a heat pipe is inserted. Fins of the second fin unit are provided with a cutout part cut out to avoid the heat pipe. The fins of the second fin unit are inserted in spaces between the fins of the first fin unit. The fins of the second fin unit reach to a region in which the fins of the second fin unit overlap the heat pipe in the first fin unit.

8 Claims, 14 Drawing Sheets

FOREIGN PATENT DOCUMENTS

| | | |
|---|---|---|
| JP | 2003-282802 A | 10/2003 |
| JP | 2003-531480 | 10/2003 |
| JP | 2006-013043 | 1/2006 |
| JP | 2007-5600 A | 1/2007 |
| JP | 2007-310716 | 11/2007 |
| JP | 2008-035033 | 2/2008 |

OTHER PUBLICATIONS

Explanation of Non-English Language References.

Notification of Reasons for Rejection issued by JPO in the corresponding to the Japanese Patent Application No. 2008-020945 on Apr. 14, 2009.

* cited by examiner

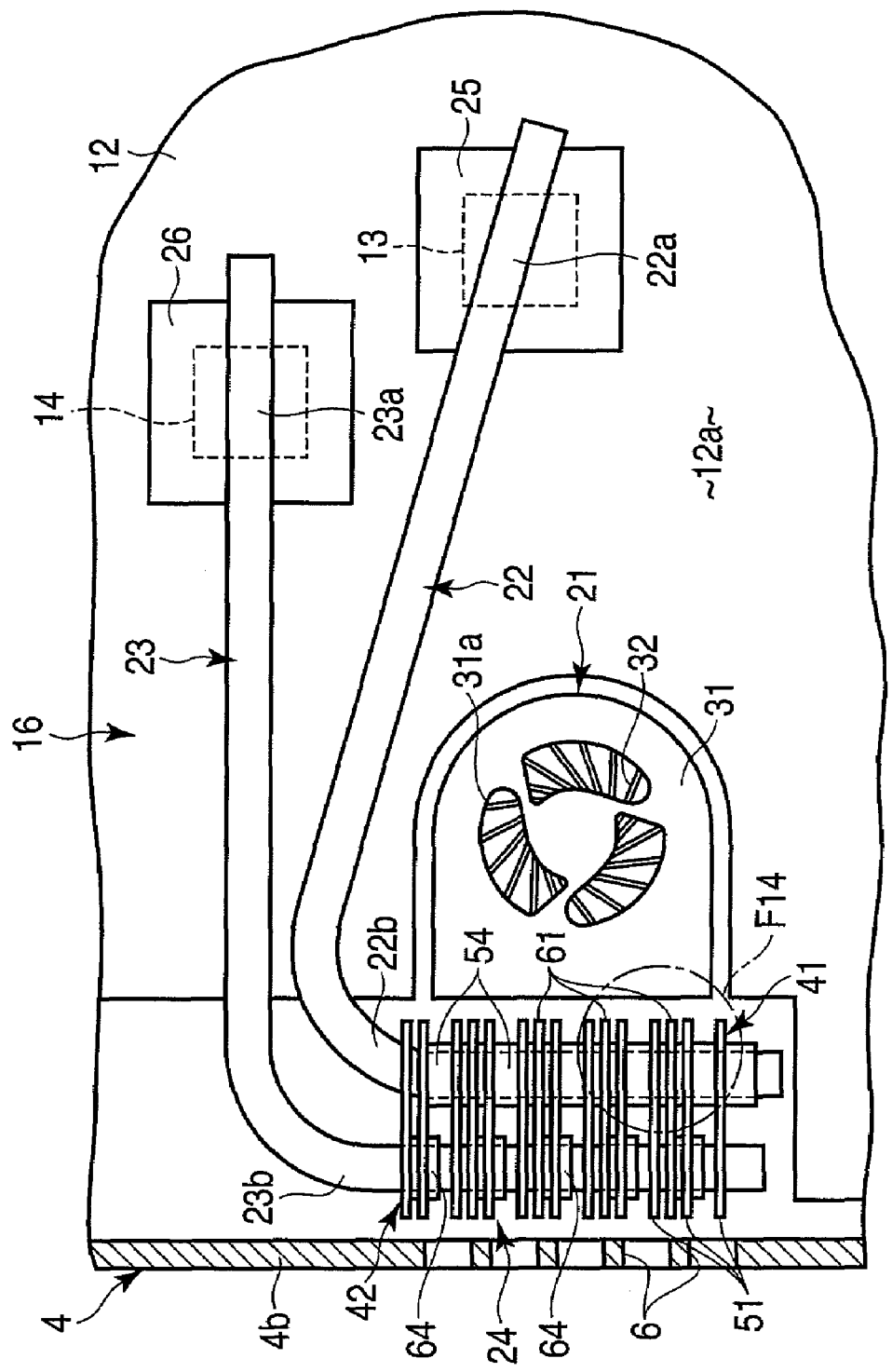
F I G. 12

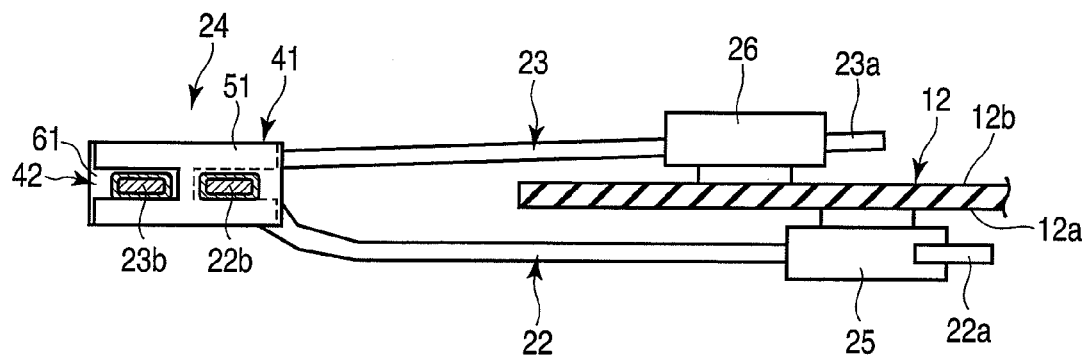
F I G. 20
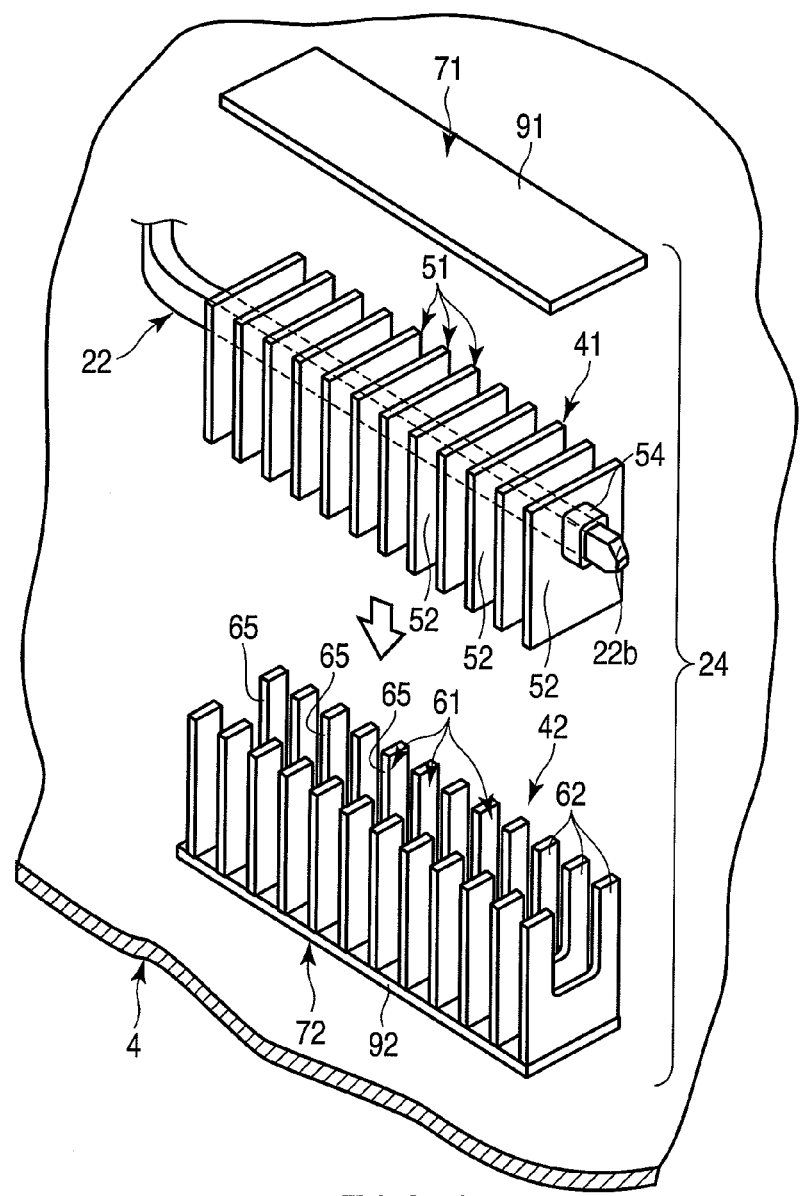
F I G. 21

ELECTRONIC APPARATUS

CROSS-REFERENCE TO RELATED APPLICATIONS

This application is based upon and claims the benefit of priority from Japanese Patent Application No. 2008-020945, filed Jan. 31, 2008, the entire contents of which are incorporated herein by reference.

BACKGROUND

1. Field

One embodiment of the invention relates to an electronic apparatus provided with a heat sink.

2. Description of the Related Art

An electronic apparatus such as a portable computer is provided with a cooling structure for cooling an exothermic component mounted in the housing. As such a cooling structure, there is a cooling structure of the remote heat exchanger (RHE) type provided with a cooling fan, a heat pipe, and a heat sink.

In Jpn. Pat. Appln. KOKAI Publication No. 8-37259, a heat-pipe type thyristor radiator provided with a plurality of juxtaposed heat sinks is disclosed. Each of the plural heat sinks are constituted of a large number of fins attached to a heat pipe. In this radiator, fins of one heat sink and fins of another heat sink are alternately shifted from each other in the attaching positions so that the radiator can be satisfactorily assembled even if there are any bends or twists in the heat pipes.

Incidentally, as for the cooling structure of an electronic apparatus such as a portable computer, an improvement in the mounting density is desired from the viewpoint of the improvement in the cooling performance and reduction in size. Under such circumstances, the present inventor has hit upon an idea of improving the mounting density associated with the cooling structure by arranging heat sink fins with a pitch smaller than in the conventional case.

However, in the heat sink of a type in which the heat sink is penetrated by the heat pipe, each fin is provided with a caulking margin part. The caulking margin part is a part necessary to caulk the fin onto the heat pipe and fix it thereto. The caulking margin part rises from the edge part of the through-hole part in which the heat pipe is inserted to extend along the circumferential surface of the heat pipe. Thus, the present inventors have found that caulking margins are present between adjacent fins, and there is a limit in narrowing the interval between fins. That is, with the heat sink of the above type, it can be said that it is difficult to improve the mounting density.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 12 is an exemplary cross-sectional view showing the inside of a portable computer according to a second embodiment of the invention;

FIG. 20 is an exemplary side view of the cooling structure shown in FIG. 19;

FIG. 21 is an exemplary perspective view showing the inside of a portable computer according to a sixth embodiment of the invention in a partially disassembled state.

DETAILED DESCRIPTION

Various embodiments according to the invention will be described hereinafter with reference to the accompanying drawings. In general, according to one embodiment of the invention, an electronic apparatus is provided with a housing; a circuit board contained in the housing; an exothermic component mounted on the circuit board; a heat pipe contained in the housing and thermally connected to the exothermic component; and a heat sink contained in the housing and penetrated by the heat pipe. The heat sink includes a first fin unit, and a second fin unit. The first fin unit includes a plurality of fins mutually arranged at intervals. The fins of the first fin unit are provided with a through-hole part in which the heat pipe is inserted. The second fin unit includes a plurality of fins mutually arranged at intervals. The fins of the second fin unit are provided with a cutout part cut out to avoid the heat pipe. The fins of the second fin unit are inserted in spaces between the fins of the first fin unit. The fins of the second fin unit reach to a region in which the fins of the second fin unit overlap the heat pipe in the first fin unit.

Embodiments of the present invention will be described below on the basis of drawings in which the embodiments are applied to a portable computer.

First Embodiment

Figure 1:
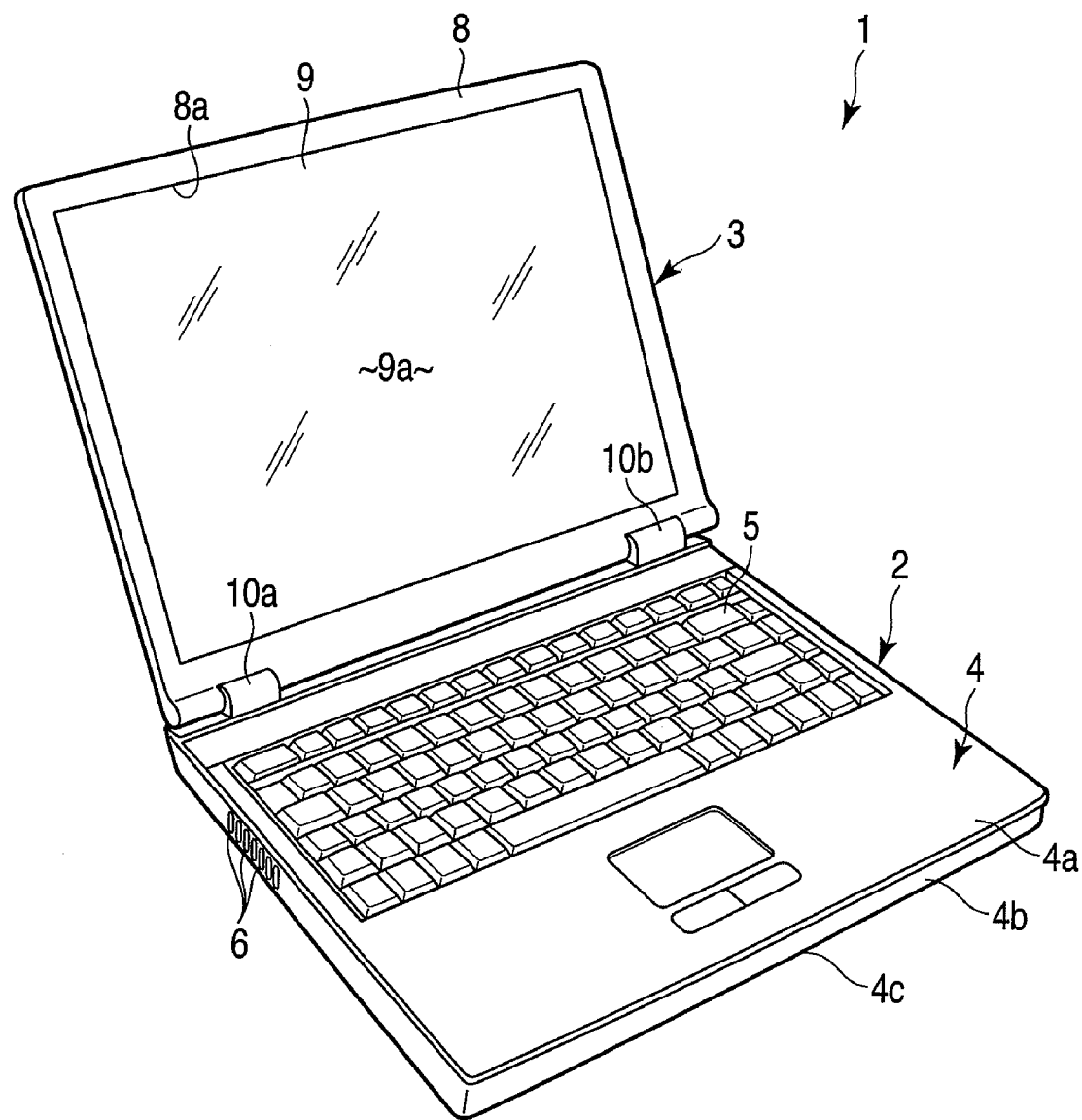
FIG. 1 is an exemplary perspective view of a portable computer according to a first embodiment of the invention.

FIGS. 1 to 11 disclose a portable computer as an electronic apparatus according to a first embodiment of the present invention. As shown in FIG. 1, a portable computer 1 includes a main unit 2, which is an electronic apparatus main body, and a display unit 3.

The main unit 2 includes a housing 4 formed into a box-like shape. The housing 4 includes an upper wall 4a, a peripheral wall 4b, and a lower wall 4c. The upper wall 4a supports a keyboard 5 thereon. The peripheral wall 4b is provided with, for example, a plurality of ventilation holes 6.

As shown in FIG. 1, the display unit 3 includes a display housing 8, and a display device 9 contained in the display housing 8. The display device 9 includes a display screen 9a. The display screen 9a is exposed to the outside of the display housing 8 through an opening part 8a in the front of the display housing 8.

The display unit 3 is supported on the rear end part of the housing 4 through, for example, a pair of hinge sections 10a and 10b. The display unit 3 is rotatable between a closed position in which the display unit 3 is laid low to cover the upper wall 4a of the housing 4 from above, and an opened position in which the display unit 3 is erected with respect to the upper wall 4a.

Figure 2:
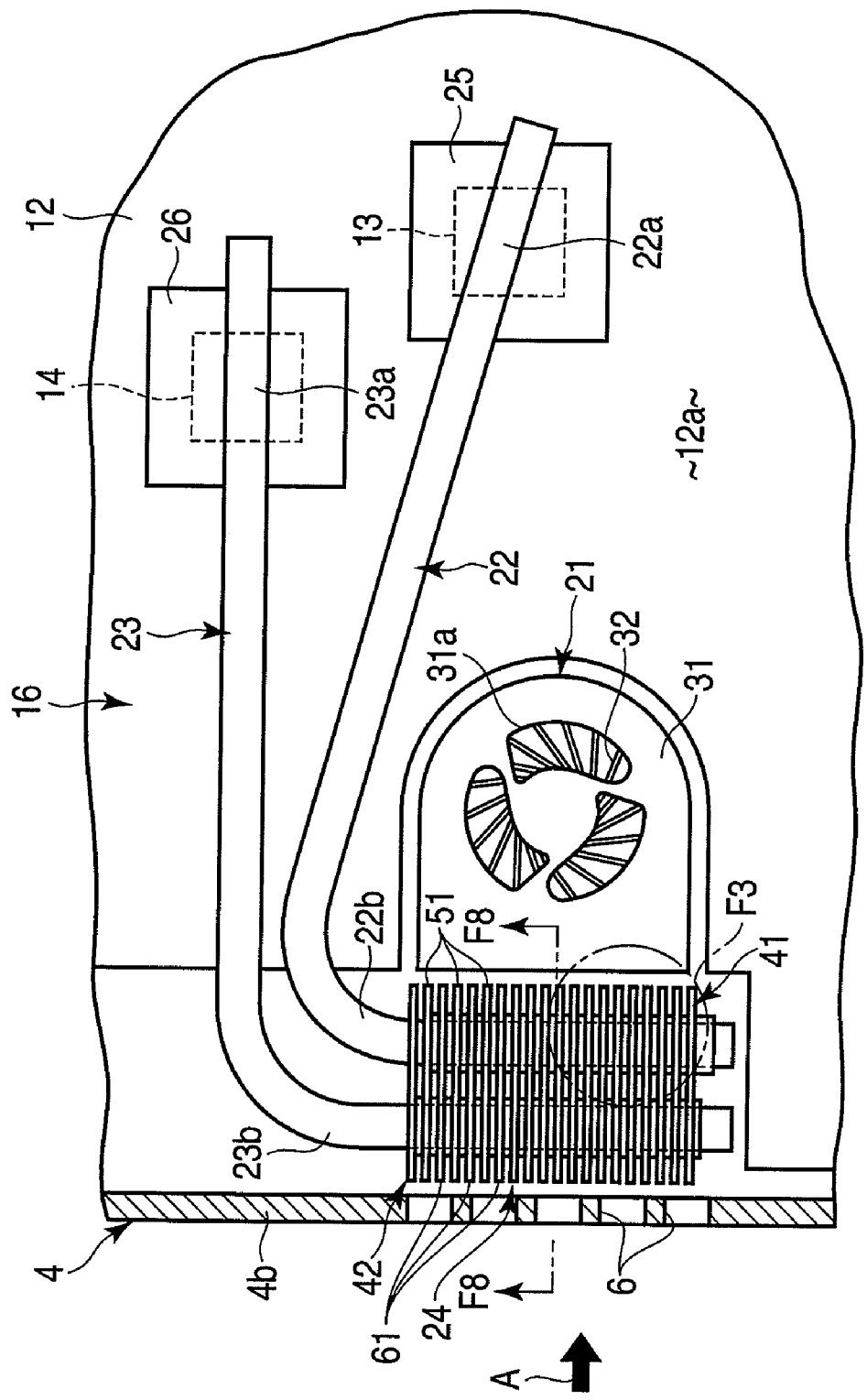
FIG. 2 is an exemplary cross-sectional view showing the inside of the portable computer shown in FIG. 1.

As shown in FIG. 2, a circuit board 12 is contained in the housing 4. First and second exothermic components 13 and 14 are mounted on the circuit board 12. Each of the first and second exothermic components 13 and 14 is an example of the exothermic components mounted in the housing mentioned in the present invention.

Each of the first and second exothermic components 13 and 14 is an electronic component which generates heat when it is in use, and specific examples thereof are a CPU, graphic chip, northbridge (trade name), memory, and the like. However, the exothermic components mentioned in the present invention are not limited to the above examples, and various components of which heat radiation is required correspond to the exothermic components. In this embodiment, the first and second exothermic components 13 and 14 are mounted on, for example, the same surface 12a of the circuit board 12.

As shown in FIG. 2, a cooling structure 16 for cooling the exothermic components 13 and 14 is provided in the housing 4. The cooling structure 16 is provided with, for example, a cooling fan 21, first and second heat pipes 22 and 23, a heat sink 24, and first and second heat receiving members 25 and 26.

The cooling fan 21 is contained in the housing 4, and is provided with a fan case 31, and fan blades 32 which rotate within the fan case 31. The cooling fan 21 includes an inlet port 31a opened inside the housing 4, and an exhaust port (not shown) opposed to the ventilation holes 6. The cooling fan 21 sucks air in the housing 4 from the inlet port 31a, and discharges the sucked air from the exhaust port.

The first and second heat pipe 22 and 23 are contained in the housing 4. As shown in FIG. 2, the first heat pipe 22 extends inside the housing 4, and includes a heat receiving section 22a, and a heat radiation section 22b. A first heat receiving member 25 is attached to the heat receiving section 22a of the first heat pipe 22. The first heat receiving member 25 is, for example, a heat receiving block or a heat receiving plate. The first heat receiving member 25 is opposed to the first exothermic component 13, and is in contact with the first exothermic component 13 with a heat connection member such as heat conduction grease interposed between them. The heat receiving section 22a of the first heat pipe 22 is thermally connected to the first exothermic component 13 through the first heat receiving member 25.

As shown in FIG. 2, the second heat pipe 23 extends inside the housing 4, and includes a heat receiving section 23a, and a heat radiation section 23b. A second heat receiving member 26 is attached to the heat receiving section 23a of the second heat pipe 23. The second heat receiving member 26 is, for example, a heat receiving block or a heat receiving plate. The second heat receiving member 26 is opposed to the second exothermic component 14, and is in contact with the second exothermic component 14 with a heat connection member such as heat conduction grease interposed between them. The heat receiving section 23a of the second heat pipe 23 is thermally connected to the second exothermic component 14 through the second heat receiving member 26.

Each of the first and second heat pipes 22 and 23 includes a container, and a working fluid encapsulated inside the container. The first heat pipe 22 receives heat from the first exothermic component 13, and transfers most of the heat to the heat sink 24. The second heat pipe 23 receives heat from the second exothermic component 14, and transfers most of the heat to the heat sink 24.

Incidentally, although not shown, the portable computer 1 is provided with a first pressing member for pressing the first heat receiving member 25 toward the first exothermic component 13, and a second pressing member for pressing the second heat receiving member 26 toward the second exothermic component 14. The first and second pressing members are, for example, leaf springs attached to the circuit board 12.

Figure 4:
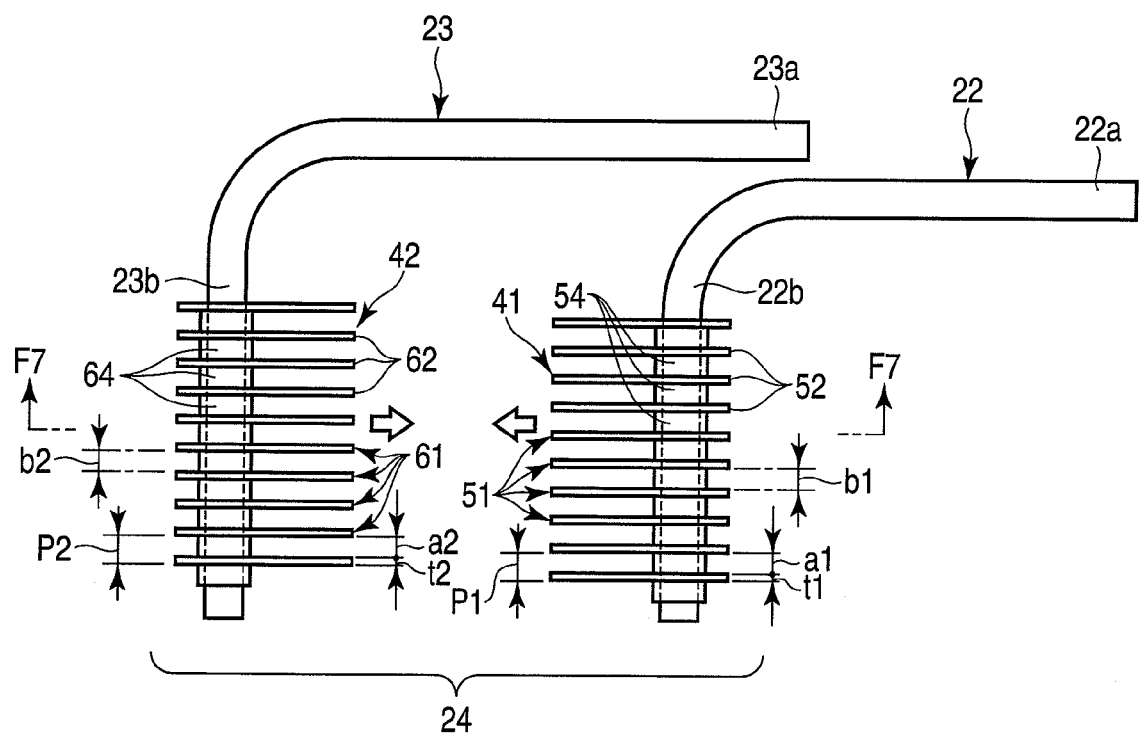
FIG. 4 is an exemplary plan view showing the heat sink shown in FIG. 2 in a disassembled state.

As shown in FIG. 2, the heat sink 24 is contained in a space between the ventilation holes 6 and the exhaust port of the cooling fan 21. The heat sink 24 is penetrated by the first and second heat pipes 22 and 23. As shown in FIG. 4, the heat sink 24 includes, for example, first and second fin units 41 and 42 which are separable from each other.

As shown in FIG. 4, the first fin unit 41 is attached to the heat radiation section 22b of the first heat pipe 22. The first fin unit 41 includes a plurality of fins 51 mutually arranged at intervals. Fins 51 are arranged with an interval a1 between them.

Figure 5:
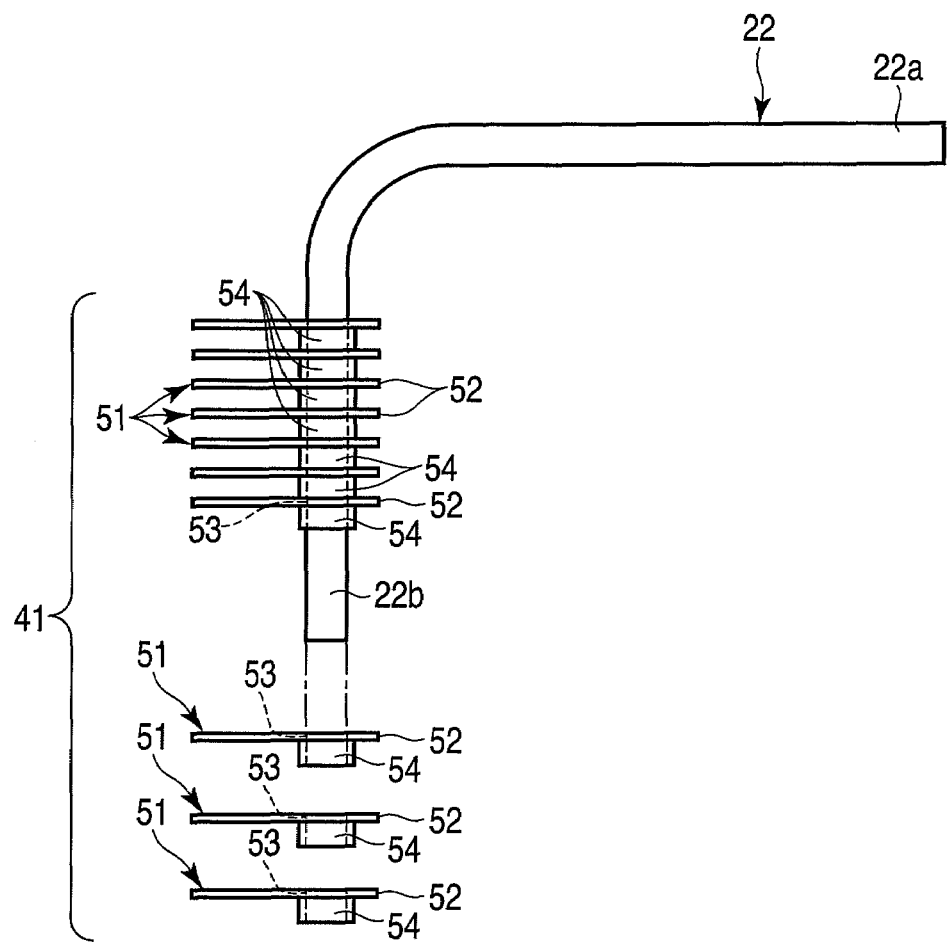
FIG. 5 is an exemplary plan view showing a first fin unit shown in FIG. 4 in a partially disassembled state.
Figure 6:
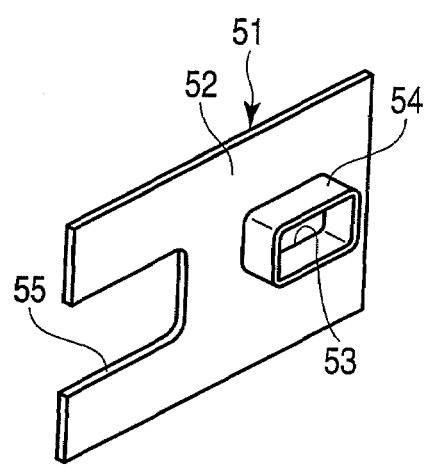
FIG. 6 is an exemplary perspective view of a fin shown in FIG. 5.

FIG. 5 shows the first fin unit 41 in a partially disassembled state. As shown in FIGS. 5 and 6, each fin 51 constituting the fin unit 41 includes a plate-like main body section 52, a through-hole part 53 provided in the main body section 52, a caulking margin part 54 provided at the edge part of the through-hole part 53, and a cutout part 55.

The through-hole part 53 includes a hole in which the first heat pipe 22 is inserted. The hole of the through-hole part 53 has, for example, an opening shape conforming to the external shape of the first heat pipe 22. The caulking margin part 54 rises from the edge part of the through-hole part 53 and extends along the circumferential surface of the first heat pipe 22, and is formed into, for example, a cylindrical shape surrounding the circumferential surface of the first heat pipe 22.

The caulking margin part 54 is a part for fixing the fin 51 to the first heat pipe 22, and is fixed to the circumferential surface of the first heat pipe 22 by caulking the section 54 onto the circumferential surface of the first heat pipe 22. Incidentally, "fixing by caulking" implies fixing a member by applying pressure to the member so as to deform the member.

As shown in FIG. 5, the first fin unit 41 is formed by attaching such fins 51 to the first heat pipe 22. Therefore, in the first fin unit 41, the caulking margin parts 54 are present between fins 51.

As shown in FIG. 4, although the interval a1 between fins 51 is not particularly limited, the interval a1 is larger than at least the width b1 of the caulking margin part 54. The interval a1 between fins 51 of the first fin unit 41 according to this embodiment is set at, for example, the same dimension as the width b1 of the caulking margin part 54.

As shown in FIG. 4, the second fin unit 42 is attached to the heat radiation section 23b of the second heat pipe 23. The second fin unit 42 includes a plurality of fins 61 mutually arranged at intervals. Fins 61 are arranged with an interval a2 between them. Each fin 61 constituting the second fin unit 42 includes, like the fin 51 of the first fin unit 41, a plate-like main body section 62, a through-hole part 63 provided in the main body section 62, a caulking margin part 64 provided at the edge part of the through-hole part 63, and a cutout part 65.

Figure 7:
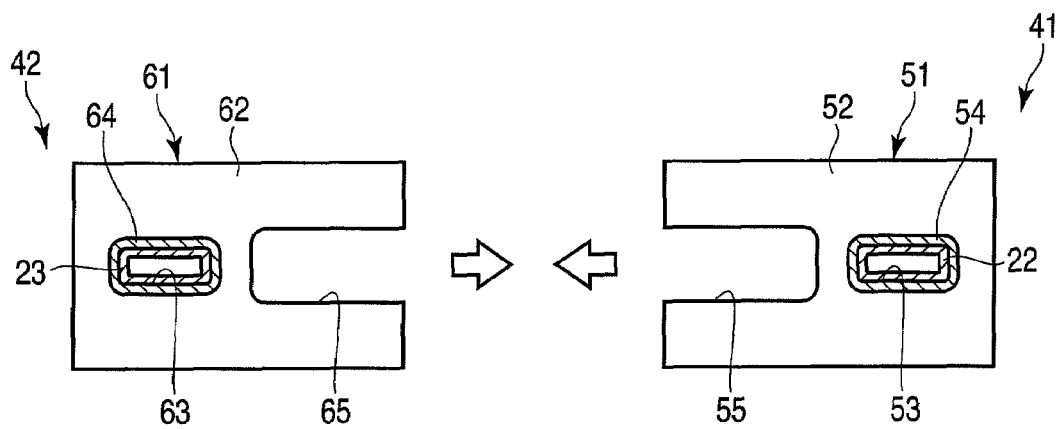
FIG. 7 is an exemplary cross-sectional view of the heat sink shown in FIG. 4 taken along line F7-F7.

As shown in FIG. 7, the through-hole part 63 includes a hole in which the second heat pipe 23 is inserted. The hole of the through-hole part 63 has, for example, an opening shape conforming to the external shape of the second heat pipe 23. The caulking margin part 64 rises from the edge part of the through-hole part 63 and extends along the circumferential surface of the second heat pipe 23, and is formed into, for example, a cylindrical shape surrounding the circumferential surface of the second heat pipe 23. The caulking margin part 64 is a part for fixing the fin 61 to the second heat pipe 23, and is fixed to the circumferential surface of the second heat pipe 23 by caulking the section 64 onto the circumferential surface of the second heat pipe 23.

As shown in FIG. 4, the second fin unit 42 is formed by attaching such fins 61 to the second heat pipe 23. Therefore, in the second fin unit 42, the caulking margin parts 64 are present between fins 61. Although the interval a2 between fins 61 is not particularly limited, the interval a2 becomes larger than at least the width b2 of the caulking margin part 64. The interval a2 between fins 61 of the second fin unit 42 according to this embodiment is set at, for example, the same dimension as the width b2 of the caulking margin part 64.

Here, the fins 61 of the second fin unit 42 are arranged in such a manner that the fins 61 coincide with the intervals between the adjacent fins 51 of the first fin unit 41. Incidentally, the expression "the fins of the second fin unit are arranged in such a manner that they coincide with the gaps between the adjacent fins of the first fin unit" implies that when the first and second fin units are combined with each other, the fins of the second fin unit enter spaces between the fins of the first fin unit.

More specifically, the case where the fins of the first and second fin units are arranged with the same intervals (see FIG. 4), the case where although the intervals of the first and second fin units are different from each other, the pitch of one of the fin units is an integral multiple of the pitch of the other fin unit (see, for example, FIG. 13), and the like correspond to the above expression. Incidentally, the present invention is not limited to these specific examples.

As shown in FIG. 4, in this embodiment, an interval a1 of the fins 51 of the first fin unit 41 is equal to an interval a2 of the fins 61 of the second fin unit 42. The pitch P1 with which the fins 51 of the first fin unit 41 are arranged is equal to the pitch P2 with which the fins 61 of the second fin unit 42 are arranged. Incidentally, the pitch P1 of the fins 51 of the first fin unit 41 implies an interval obtained by adding a thickness t1 of the fin 51 to an interval a1 between adjacent fins 51. Likewise, the pitch P2 of the fins 61 of the second fin unit 42 implies an interval obtained by adding a thickness t2 of the fin 61 to an interval a2 between adjacent fins 61.

The second fin unit 42 is combined with the first fin unit 41 in such a manner that the fins 61 of the second fin unit 42 are inserted in spaces between the fins 51 of the first fin unit 41.

Figure 3:
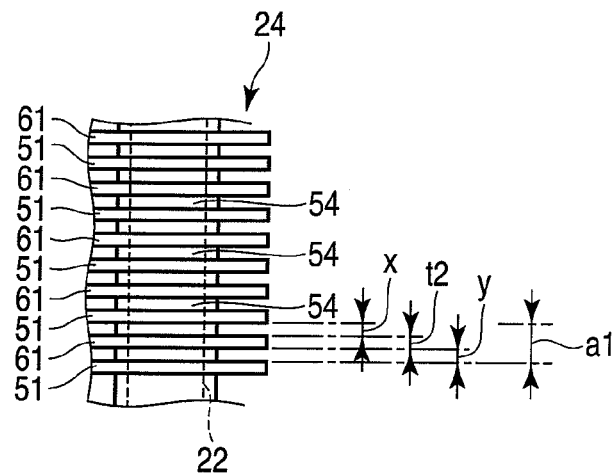
FIG. 3 is an exemplary plan view showing a region of the heat sink shown in FIG. 2 encircled by a line F3 in an enlarging manner.

As a result of this, as shown in FIGS. 2 and 3, the fins 61 of the second fin unit 42 are present within the gaps between the fins 51 of the first fin unit 41. That is, when the intervals x and y between the fin 51 and the fin 61 are defined as shown in FIG. 3, the sum total of the intervals x and y, and the plate thickness t2 of the fin 61 becomes equal to the interval a1 between the fins 51.

Here, as shown in FIG. 7, the fin 61 of the second fin unit 42 is provided with the cutout part 65 which is cut out to avoid the first heat pipe 22. Likewise, the fin 51 of the first fin unit 41 is provided with the cutout part 55 which is cut out to avoid the second heat pipe 23.

Figure 8:
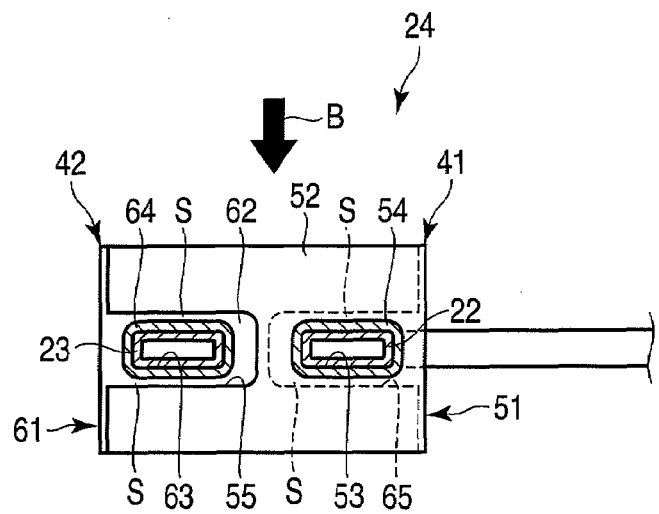
FIG. 8 is an exemplary cross-sectional view of the heat sink shown in FIG. 2 taken along line F8-F8.

As a result of this, as shown in FIGS. 2 and 8, the first and second fin units 41 and 42 are deeply combined with each other. More specifically, the fin 61 of the second fin unit 42 enters the first fin unit 41 up to a region therein vertically covering the first heat pipe 22. The fins 61 of the second fin unit 42 reach to a region in which the fins 61 overlap the first heat pipe 22 in the first fin unit 41. Likewise, the fin 51 of the first fin unit 41 enters the second fin unit 42 up to a region therein vertically covering the second heat pipe 23. The fins 51 of the first fin unit 41 reach to a region in which the fins 51 overlap the second heat pipe 23 in the second fin unit 42.

Incidentally, the expression "the fins of the second fin unit reach to a region in which the fins of the second fin unit overlap the first heat pipe" implies that the first heat pipe is passed through a region formed by the cutout part of the fin of the second fin unit. In other words, the above expression implies that when the first and second fin units are viewed from a direction B (see FIG. 8) perpendicular to the direction in which the first and second fin units are combined with each other, the fins of the second fin unit overlap the first heat pipe.

Likewise, the expression "the fins of the first fin unit reach to a region in which the fins of the first fin unit overlap the second heat pipe" implies that the second heat pipe is passed through a region formed by the cutout part of the fin of the first fin unit. In other words, the above expression implies that when the first and second fin units are viewed from a direction B perpendicular to the direction in which the first and second fin units are combined with each other, the fins of the first fin unit overlap the second heat pipe.

As shown in FIG. 8, the cutout part 65 of the second fin unit 42 is cut out larger than, for example, the outer shape of the caulking margin part 54 of the first fin unit 41. Likewise, the cutout part 55 of the first fin unit 41 is cut out larger than, for example, the outer shape of the caulking margin part 64 of the second fin unit 42.

As a result of this, as shown in FIG. 2, the fins 61 of the second fin unit 42 reach to a region in which the fins 61 of the second fin unit 42 overlap the caulking margin parts 54 of the fins 51 of the first fin unit 41. Likewise, the fins 51 of the first fin unit 41 reach to a region in which the fins 51 of the first fin unit 41 overlap the caulking margin part 64 of the fins 61 of the second fin unit 42.

As shown in FIG. 8, the cutout part 55 of the first fin unit 41 is formed a size larger than the outer shape of the caulking margin part 64 of the fin 61 of the second fin unit 42. That is, a first clearance part S is provided between the cutout part 55 of the fin 51 of the first fin unit 41 and the caulking margin part 64 of the fin 61 of the second fin unit 42.

Likewise, the cutout part 65 of the second fin unit 42 is formed a size larger than the outer shape of the caulking margin part 54 of the fin 51 of the first fin unit 41. That is, a second clearance part S is provided between the cutout part 65 of the fin 61 of the second fin unit 42 and the caulking margin part 54 of the fin 51 of the first fin unit 41. As a result of this, the first fin unit 41 is displaceable with respect to the second fin unit 42.

The second fin unit 42 is not thermally connected to the first heat pipe 22 positively. The first fin unit 41 is not thermally connected to the second heat pipe 23 positively.

Figure 9:
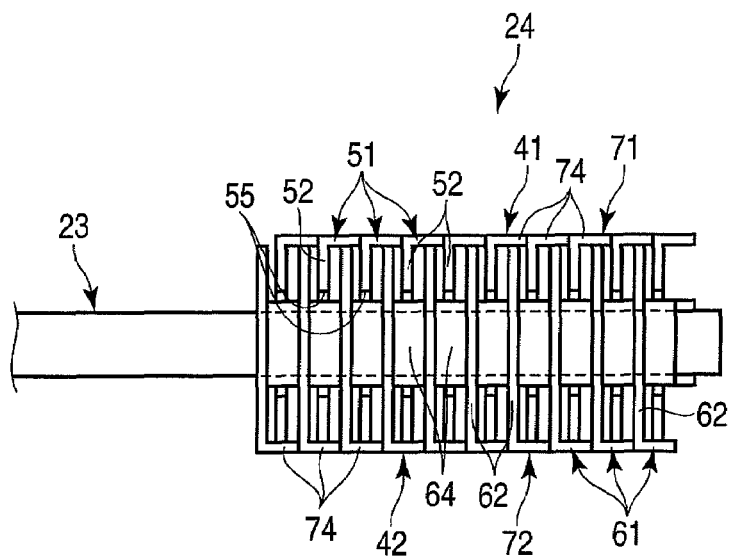
FIG. 9 is an exemplary front view of the heat sink shown in FIG. 2 viewed from a direction of an arrow A.

FIG. 9 is a view of the heat sink 24 viewed from the lateral direction (direction A in FIG. 2). As shown in FIG. 8, the heat sink 24 includes a first cover section 71 for preventing air from leaking, for example, upwardly from the heat sink 24, and a second cover section 72 for preventing air from leaking, for example, downwardly from the heat sink 24.

Figure 10:
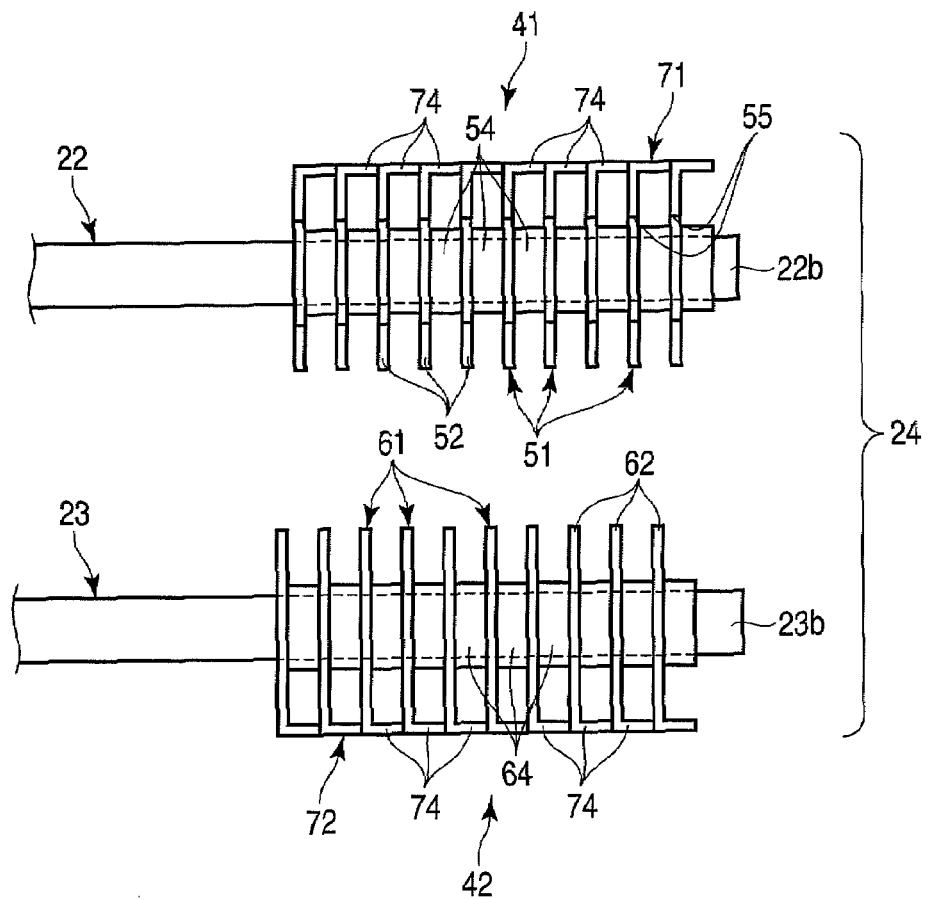
FIG. 10 is an exemplary front view of the heat sink shown in FIG. 9 in a disassembled state.

FIG. 10 shows the heat sink 24 shown in FIG. 9 by disassembling the heat sink 24 into the first and second fin units 41 and 42. As shown in FIG. 10, each of the fins 51 of the first fin unit 41 is provided with a bent section 74 bent toward the adjacent fin 51 at, for example, the entire width of the upper end thereof. The first cover section 71 is formed by the cooperation of the bent sections 74 of a plurality of fins 51 formed into an L-shape.

Each of the fins 61 of the second fin unit 42 is provided with a bent section 74 bent toward the adjacent fin 61 at, for example, the entire width of the lower end thereof. The second cover section 72 is formed by the cooperation of the bent sections 74 of a plurality of fins 61 formed into an L-shape.

Next, the function of the portable computer 1 will be described below.

When the portable computer 1 is used, the first and second exothermic components 13 and 14 generate heat. Most of the heat generated by the first exothermic component 13 is conducted to the first fin unit 41 by the first heat pipe 22. Most of the heat generated by the second exothermic component 14 is conducted to the second fin unit 42 by the second heat pipe 23. The heat conducted to the first and second fin units 41 and 42 is radiated by the fin units 41 and 42 forcedly cooled by the cooling fan 21.

According to the portable computer 1 configured as described above, it is possible to improve the mounting density related to the cooling structure. The fin unit 41 in which caulking margin parts 54 are present between fins 51 is prepared, another fin unit 42 in which fins 61 are arranged in such a manner that the fins coincide with the gaps between the fins 51 is prepared for the fin unit 41, and the two fin units 41 and 42 are combined with each other by inserting the fins 61 of the fin unit 42 between the fins 51 of the fin unit 41, whereby it is possible to obtain a heat sink 24 in which fins are arranged with a pitch finer than the limit due to the caulking margin part 54. As a result of this, it is possible to improve the mounting density related to the cooling structure.

Particularly, in the case where the fin 61 of the second fin unit 42 is provided with a cutout part 65 cut out to avoid the first heat pipe 22, and the fin 61 can enter the first fin unit 41 up to a region therein vertically covering the first heat pipe 22, it is possible to arrange the fins 61 of the second fin unit 42 while utilizing the gaps in the first fin unit 41 more effectively. As a result of this, it is possible to further improve the mounting density related to the cooling structure.

In the case where the mounting density related to the cooling structure can be improved, the cooling performance can be enhanced, for example, when the same mounting area as before is used and, for example, when the same cooling performance as before is secured, the mounting area can be made smaller than before.

In the case where the cutout part 65 of the fin 61 of the second fin unit 42 is cut out larger than the outer shape of the caulking margin part 54 of the first fin unit 41, the fin 61 of the second fin unit 42 can be arranged in the region in which the caulking margin part 54 is present. That is, the fin 61 of the second fin unit 42 can be arranged without being limited by the caulking margin part 54. As a result of this, the mounting density related to the cooling structure can be further improved.

In the case where each of the plural fins 61 of the second fin unit 42 is provided with the through-hole part 63 in which the second heat pipe 23 is inserted, and the caulking margin part 64 rising from the edge part of the through-hole part 63, the second heat pipe 23 can be attached to the second fin unit 42. As a result of this, even in the heat sink 24 is penetrated by the two heat pipes 22 and 23, the mounting density related to the cooling structure can be improved.

In the case where each of the plural fins 51 of the first fin unit 41 is provided with a cutout part 55 cut out to avoid the second heat pipe 23, and the fin 51 can enter the second fin unit 42 up to a region therein vertically covering the second heat pipe 23, it is possible to arrange the fins 51 of the first fin unit 41 while utilizing the gaps in the second fin unit 42 more effectively. As a result of this, it is possible to further improve the mounting density related to the cooling structure.

Figure 11:
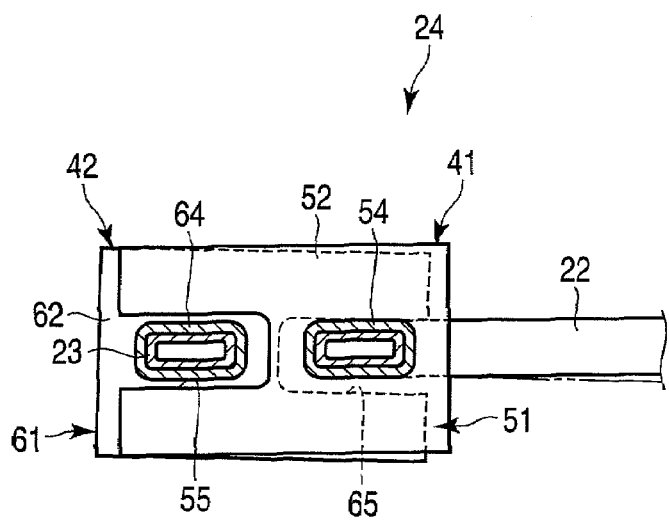
FIG. 11 is an exemplary cross-sectional view showing a state where the first fin unit shown in FIG. 8 is inclined with respect to a second fin unit.

In the case where the first clearance S is provided between the caulking margin part 54 of the fin 51 of the first fin unit 41 and the cutout part 65 of the fin 61 of the second fin unit 42, and the second clearance S is provided between the caulking margin part 64 of the fin 61 of the second fin unit 42 and the cutout part 55 of the fin 51 of the first fin unit 41, the first fin unit 41 can be inclined with respect to the second fin unit 42 as shown in FIG. 11.

As a result of this, in the case where a component tolerance accompanying a crook is present in one of or both the first and second exothermic components 13 and 14, the first and second heat pipes 22 and 23, and the first and second fin units 41 and 42 can follow the crook. That is, the heat sink 24 can absorb the component tolerances of the first and second exothermic components 13 and 14. As a result of this, a large load is not imposed on the first and second exothermic components 13 and 14 due to uneven contact or the like, and the first and second exothermic components 13, 14 can be prevented from being damaged.

In the case where an interval a1 of the fins 61 of the second fin unit 42 is equal to an interval a2 of the fins 51 of the first fin unit 41, the mounting density related to the cooling structure can be enhanced.

Second Embodiment

Figure 13:
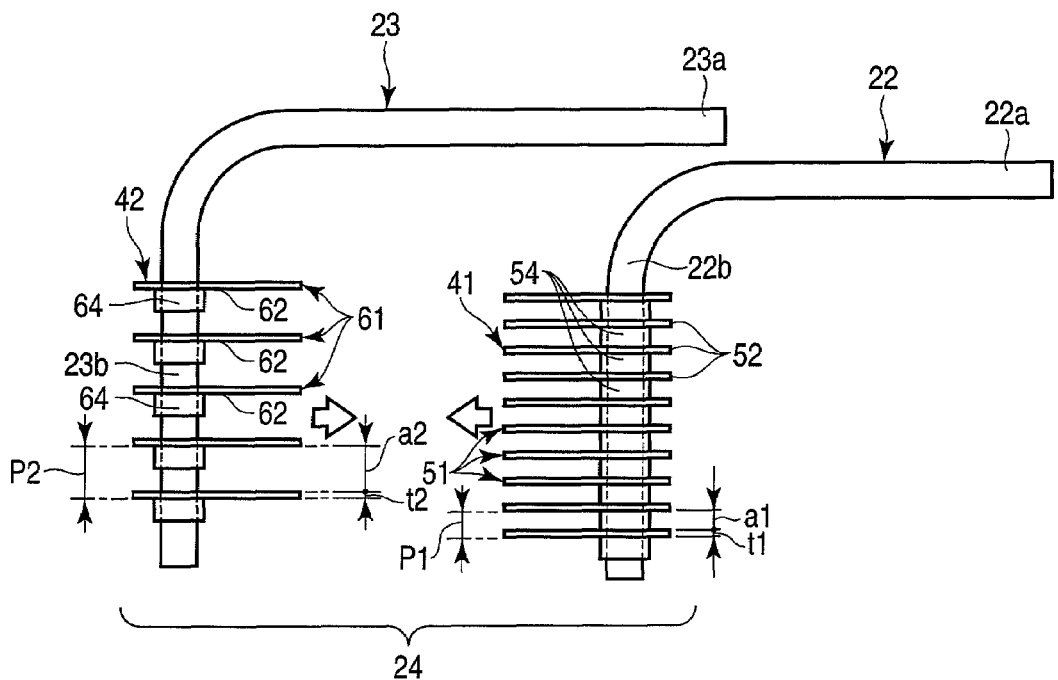
FIG. 13 is an exemplary plan view showing the heat sink shown in FIG. 12 in a disassembled state.
Figure 14:
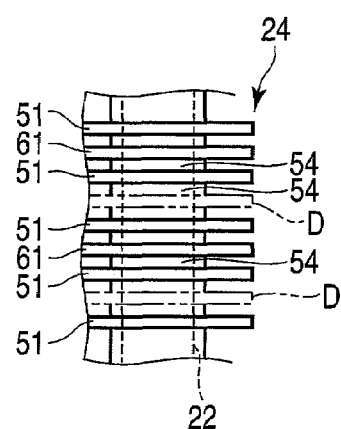
FIG. 14 is an exemplary plan view showing a region of the heat sink shown in FIG. 12 encircled by a line F14 in an enlarging manner.

A portable computer 1 as an electronic apparatus according to a second embodiment of the present invention will be described below with reference to FIGS. 12 to 14. Incidentally, the configuration having a function identical with or similar to that of the configuration of the first embodiment described above is denoted by the same reference symbol, and a description thereof is omitted.

FIG. 12 shows a heat sink 24 according to this embodiment. FIG. 13 shows a heat sink 24 shown in FIG. 12 by disassembling the heat sink 24 into first and second fin units 41 and 42. Fins 61 of the second fin unit 42 are arranged in such a manner that the fins 61 coincide with gaps between fins 51 of the first fin unit 41. Incidentally, as shown in FIG. 13, the first and second fin units 41 and 42 differ from each other in the pitch with which the fins are arranged.

In this embodiment, the second exothermic component 14 is smaller than the first exothermic component 13 in the heat generation amount. Further, an interval a2 of the fins 61 of the second fin unit 42 is larger than an interval a1 of the fins 51 of the first fin unit 41. In other words, it can be said that in the second fin unit, the fins are thinned out as compared with the first fin unit 41.

The pitch P2 with which the fins 61 of the second fin unit 42 are arranged is, for example, twice as large as the pitch P1 with which the fins 51 of the first fin unit 41 are arranged. As a result of this, as shown in FIG. 14, there are parts D in which the fin 61 of the second fin unit 42 is absent, between the fins 51 of the first fin unit 41.

Here, the second fin unit 42 is not thermally connected to the first heat pipe 22. The first fin unit 41 is not thermally connected to the second heat pipe 23. The configuration of the portable computer 1 other than that described above is the same as the first embodiment.

With such a configuration, it is possible to improve the mounting density related to the cooling structure as in the first embodiment. Further, in this embodiment, in one of the first and second fin units 41 and 42, i.e., the fin unit 42 thermally connected to one of the first and second exothermic components 13 and 14 a heat generation amount of which is smaller than the other, fins are arranged with a larger interval than that of the other fin unit 41.

By thinning out the fins of the fin unit thermally connected to the exothermic component generating the smaller amount of heat, it is possible to appropriately secure the cooling performance necessary for the exothermic component, and provide a heat sink in which a pressure drop is small. That is, it is possible to provide a heat sink which can improve the mounting density related to the cooling structure, and in which suppression of a pressure drop is considered.

Incidentally, in the above embodiment, the case where the heat generation amount of the second exothermic component 14 is relatively small has been exemplified. In place of the above, the heat generation amount of the first exothermic component 13 may be smaller than that of the second exothermic component 14, and fins may be arranged with a larger interval in the first fin unit 41 than that of the second fin unit 42.

Third Embodiment

A portable computer 1 as an electronic apparatus according to a third embodiment of the present invention will be described below with reference to FIGS. 15 to 17. Incidentally, the configuration having a function identical with or similar to that of the configuration of the first embodiment described above is denoted by the same reference symbol, and a description thereof is omitted.

Figure 15:
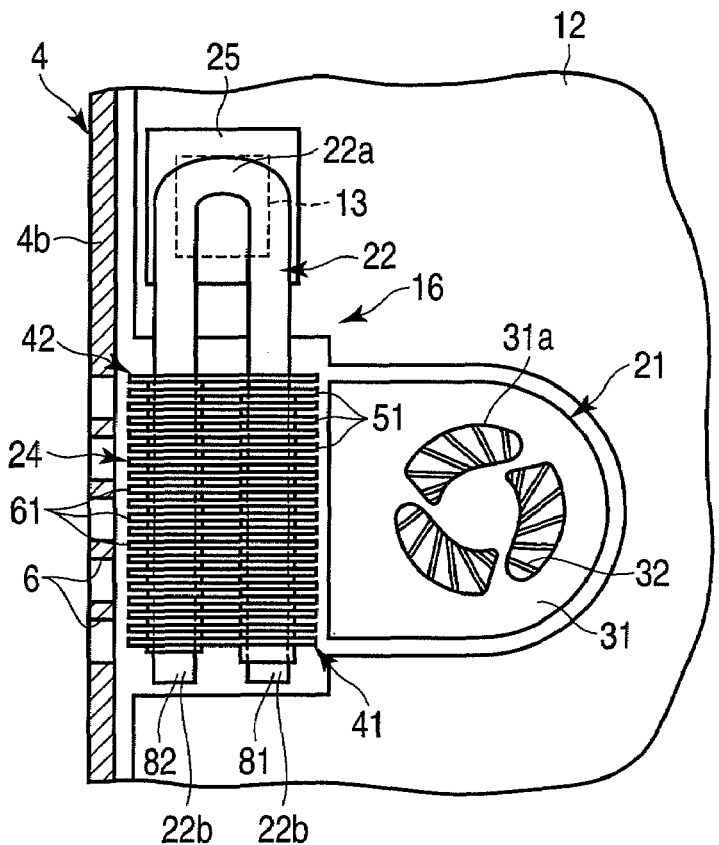
FIG. 15 is an exemplary cross-sectional view showing the inside of a portable computer according to a third embodiment of the invention.
Figure 16:
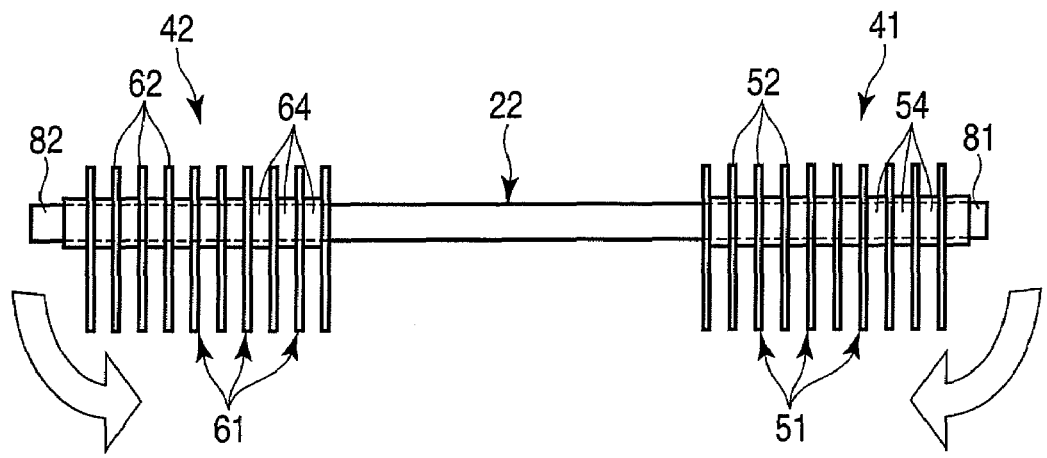
FIG. 16 is an exemplary plan view showing a state of the heat pipe shown in FIG. 15 before the heat pipe is bent.

As shown in FIG. 15, the cooling structure according to this embodiment is provided with a heat pipe 22 attached to a heat sink 24. As shown in FIG. 16, a first fin unit 41 is provided on one end portion 81 of the heat pipe 22. A second fin unit 42 is provided on the other end portion 82 of the heat pipe 22.

Figure 17:
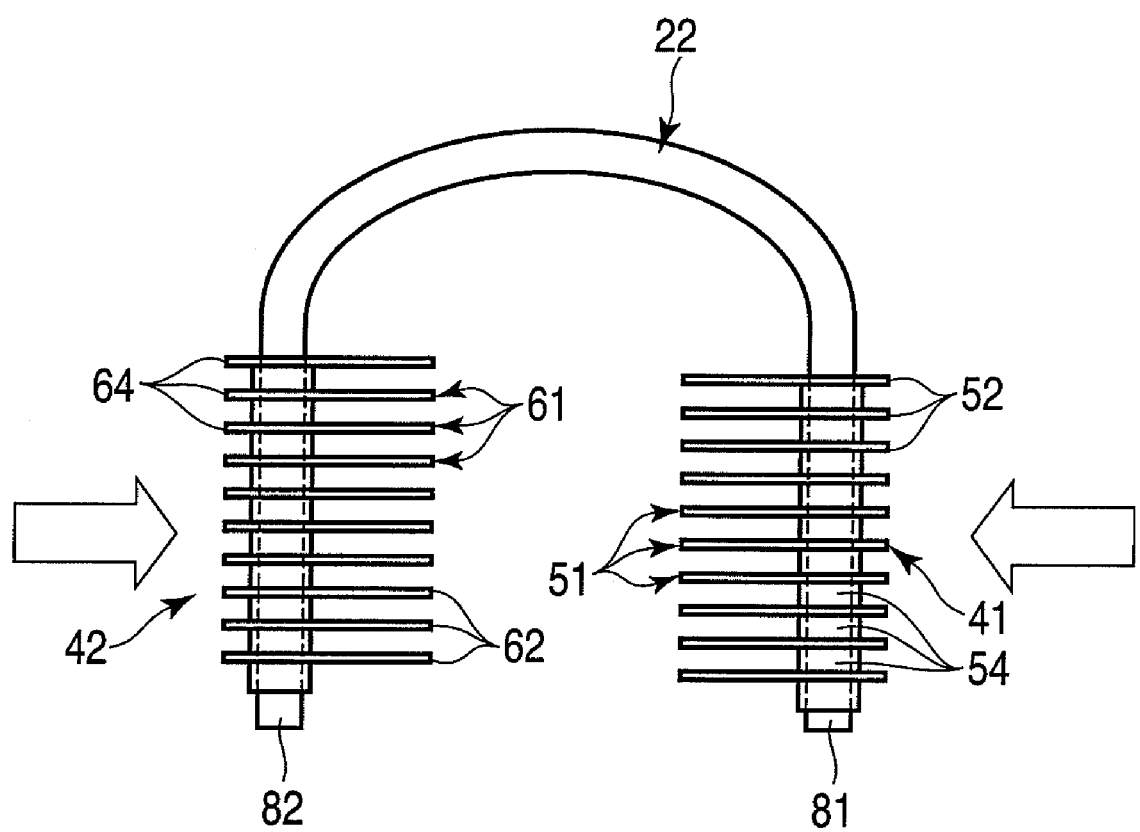
FIG. 17 is an exemplary plan view showing a bending process of the heat pipe shown in FIG. 15.

As shown in FIG. 17, the heat pipe 22 is bent by 180° in such a manner that the first and second fin units 41 and 42 are opposed to each other, and the first and second fin units 41 and 42 are combined with each other by being caused to overlap each other.

As shown in FIG. 15, in the heat pipe 22, the part at which the heat pipe 22 is bent by 180° becomes a heat receiving section 22a. A heat receiving member 25 is attached to the heat receiving section 22a of the heat pipe 22. The heat receiving member 25 is opposed to an exothermic component 13, and is in contact with the exothermic component 13 with a heat connection member such as heat conduction grease interposed between them. The heat receiving section 22a of the heat pipe 22 is thermally connected to the exothermic component 13 through the heat receiving member 25. The configuration of the portable computer 1 other than that described above is the same as the first embodiment.

With such a configuration, it is possible to improve the mounting density related to the cooling structure as in the first embodiment. Further, in the case where the first fin unit 41 is provided on one end portion 81 of the heat pipe 22, the second fin unit 42 is provided on the other end portion 82 of the heat pipe 22, the heat pipe 22 is bent, and the first and second fin units 41 and 42 are combined with each other, it is possible to reduce the number of heat pipes as compared with, for example, a case where a heat pipe is attached to each of the first and second fin units 41 and 42. As a result of this, it is possible to improve the mounting density related to the cooling structure, and reduce the cost related to the cooling structure.

Fourth Embodiment

A portable computer 1 as an electronic apparatus according to a fourth embodiment of the present invention will be described below with reference to FIG. 18. Incidentally, the configuration having a function identical with or similar to that of the configuration of the first embodiment described above is denoted by the same reference symbol, and a description thereof is omitted.

Figure 18:
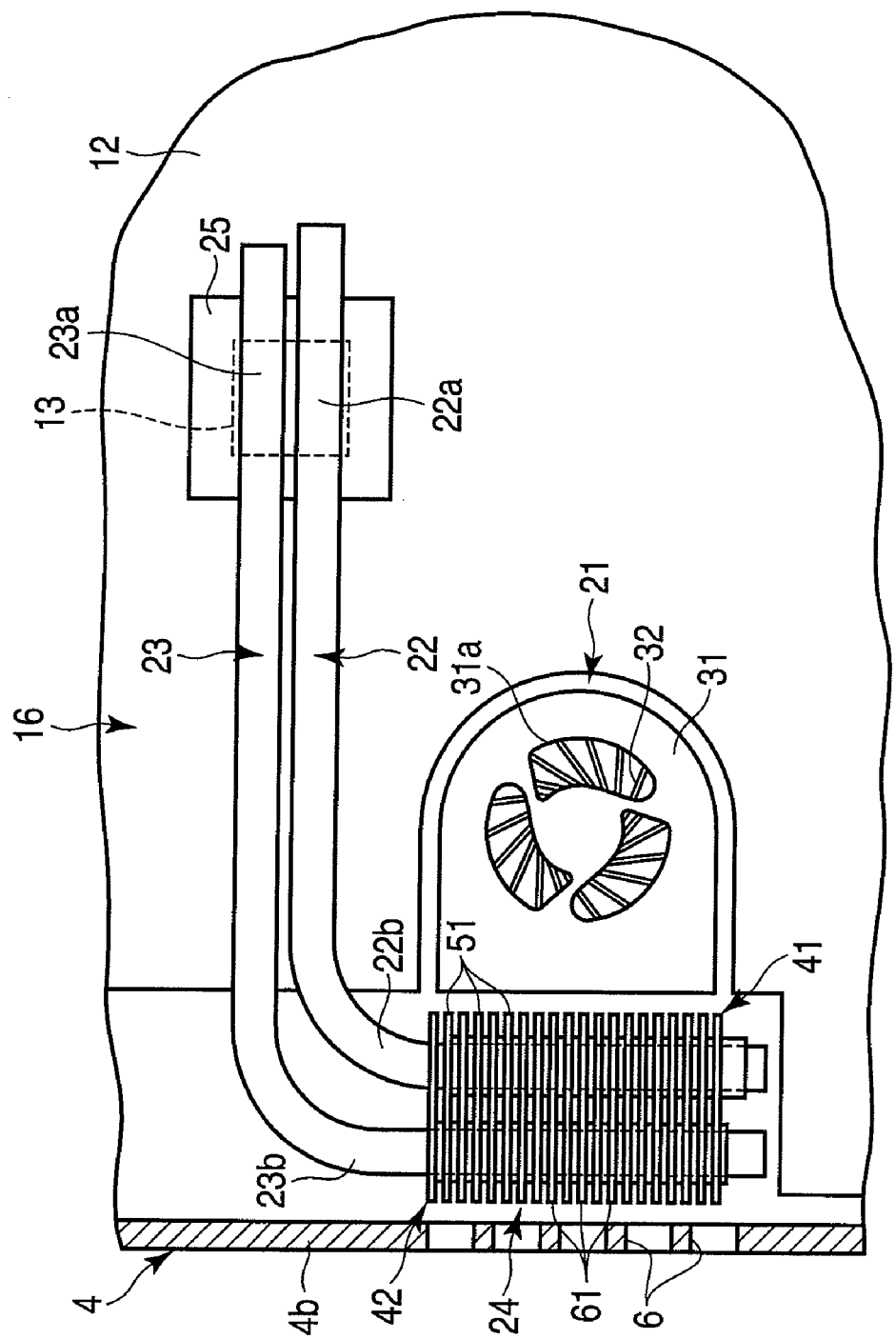
FIG. 18 is an exemplary cross-sectional view showing the inside of a portable computer according to a fourth embodiment of the invention.

As shown in FIG. 18, an exothermic component 13 is mounted on a circuit board 12. A heat receiving member 25 is attached to a heat receiving section 22a of a first heat pipe 22. The heat receiving member 25 is opposed to the exothermic component 13, and is in contact with the exothermic component 13 with a heat connection member such as heat conduction grease interposed between them. The heat receiving section 22a of the first heat pipe 22 is thermally connected to the exothermic component 13 through the heat receiving member 25.

A heat receiving section 23a of a second heat pipe 23 is attached to the heat receiving member 25 together with the first heat pipe 22. The heat receiving section 23a of the second heat pipe 23 is thermally connected to the exothermic component 13 through the heat receiving member 25. The configuration of the portable computer 1 other than that described above is the same as the first embodiment.

With such a configuration, it is possible to improve the mounting density related to the cooling structure as in the first embodiment. Incidentally, in this embodiment, the first fin unit 41 may be thermally connected to the second heat pipe 23 positively. The second fin unit 42 may be thermally connected to the first heat pipe 22 positively.

Fifth Embodiment

Figure 19:
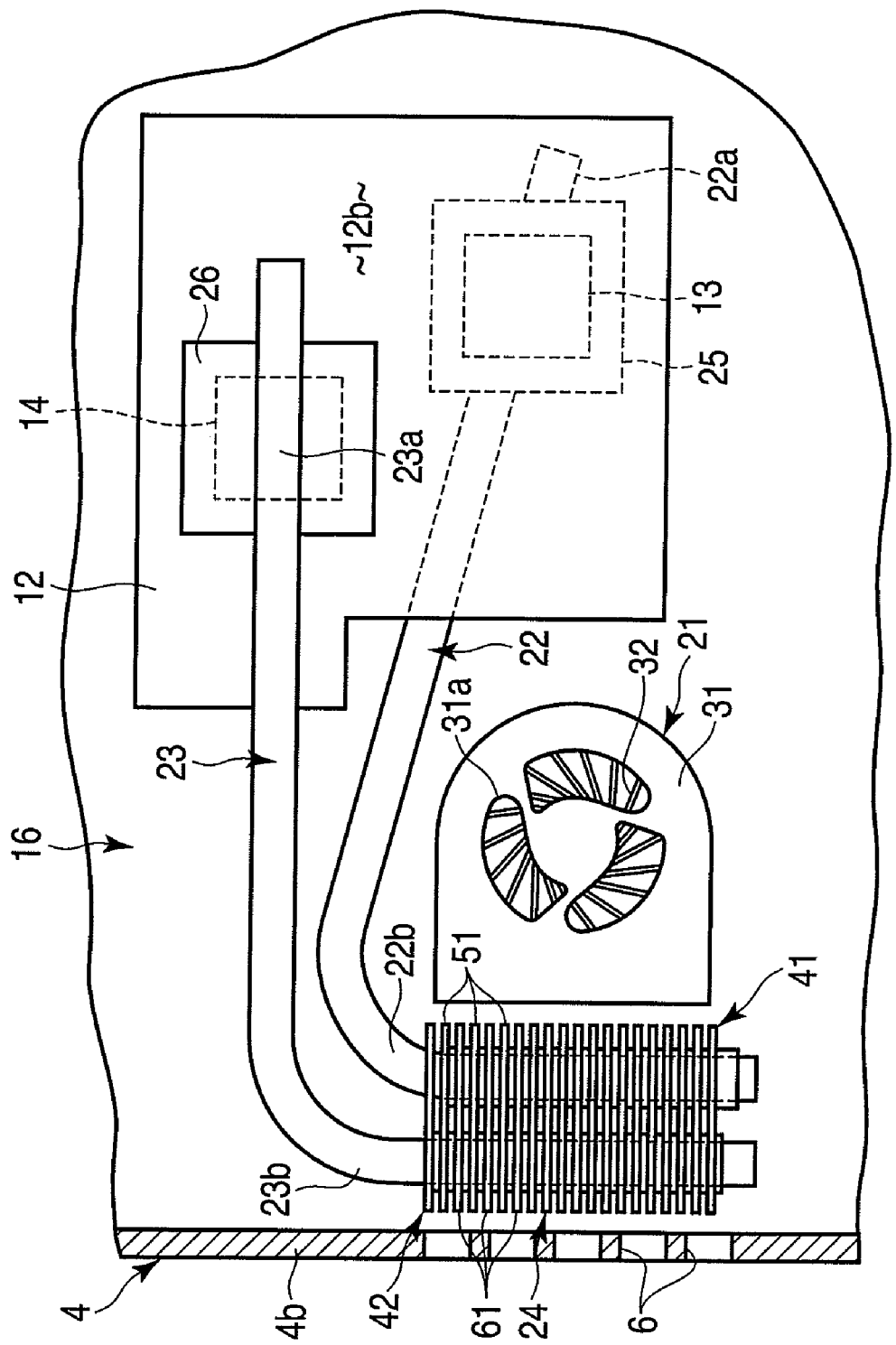
FIG. 19 is an exemplary cross-sectional view showing the inside of a portable computer according to a fifth embodiment of the invention.

A portable computer 1 as an electronic apparatus according to a fifth embodiment of the present invention will be described below with reference to FIGS. 19 and 20. Incidentally, the configuration having a function identical with or similar to that of the configuration of the first embodiment described above is denoted by the same reference symbol, and a description thereof is omitted.

As shown in FIG. 20, a circuit board 12 is contained in a housing 4. This circuit board 12 includes a first surface 12a, and a second surface 12b which is on the backside of the first surface 12a. A first exothermic component 13 is mounted on the first surface 12a of the circuit board 12. A second exothermic component 14 is mounted on the second surface 12b of the circuit board 12. That is, the first and second exothermic components 13 and 14 are mounted on both sides of the circuit board 12 separately from each other. The configuration of the portable computer 1 other than that described above is the same as the first embodiment.

With such a configuration, it is possible to improve the mounting density related to the cooling structure as in the first embodiment.

Sixth Embodiment

A portable computer 1 as an electronic apparatus according to a sixth embodiment of the present invention will be described below with reference to FIG. 21. Incidentally, the configuration having a function identical with or similar to that of the configuration of the first embodiment described above is denoted by the same reference symbol, and a description thereof is omitted.

No heat pipe is attached to a second fin unit 42 according to this embodiment. Therefore, each of fins 61 of the second fin unit 42 is not provided with a through-hole part 63 and caulking margin part 64. Further, each of fins 51 of a first fin unit 41 is not provided with a cutout part 55. On the other hand, a heat pipe 22 is attached to a first fin unit 41.

The second fin unit 42 is fixed to, for example, a housing 4. The second fin unit 42 is combined with the first fin unit 41 in such a manner that the fins 61 of the second fin unit 42 are inserted in spaces between the fins 51 of the first fin unit 41. The fin unit 42 according to this embodiment is thermally connected to the heat pipe 22 positively through a heat connection member (not shown). The second fin unit 42 promotes the heat radiation of the heat pipe 22.

Each of first and second cover sections 71 and 72 of a heat sink 24 is formed of a plate member 91 or 92 extending over the entire length of the heat sink 24. Incidentally, the entire length of the heat sink 24 is a length thereof in the direction in which the fins are arranged. The configuration of the portable computer 1 other than that described above is the same as the first embodiment.

With such a configuration, it is possible to improve the mounting density related to the cooling structure as in the first embodiment. That is, the heat sink 24 including the first and second fin units 41 and 42 may be used to cool the one heat pipe 22.

The portable computer 1 according to each of the first to sixth embodiments has been described. However, the present invention is not limited to these. Each of the constituent elements according to the first to sixth embodiments may be appropriately combined with each other to be used. For example, in the second embodiment, the first and second heat pipes 22 and 23 may be thermally connected to the same exothermic component as in the fourth embodiment. Further, in the second embodiment, the first and second exothermic components 13 and 14 may be mounted on both sides of the circuit board separately from each other as in the fifth embodiment.

Further, the present invention is not limited to the above-mentioned embodiments as they are. In the implementation stage, the constituent elements may be modified and embodied within the scope not deviating from the gist of the invention. For example, the second heat pipe 23 is not limited to that penetrating the heat sink. The second heat pipe 23 may be a heat pipe attached to the second fin unit 42 along an undersurface section of the unit 42 or the like.

The first and second cover sections 71 and 72 of the fin units 41 and 42 are not limited to those formed by bending the end part of each fin. As in the sixth embodiment, fins having no bent sections are arranged, and plate members 91 and 92 attached to the first and second fin units 41 and 42 from above and from below over the entire length of the fin units 41 and 42 may be made the first and second cover sections 71 and 72.

Figure 22:
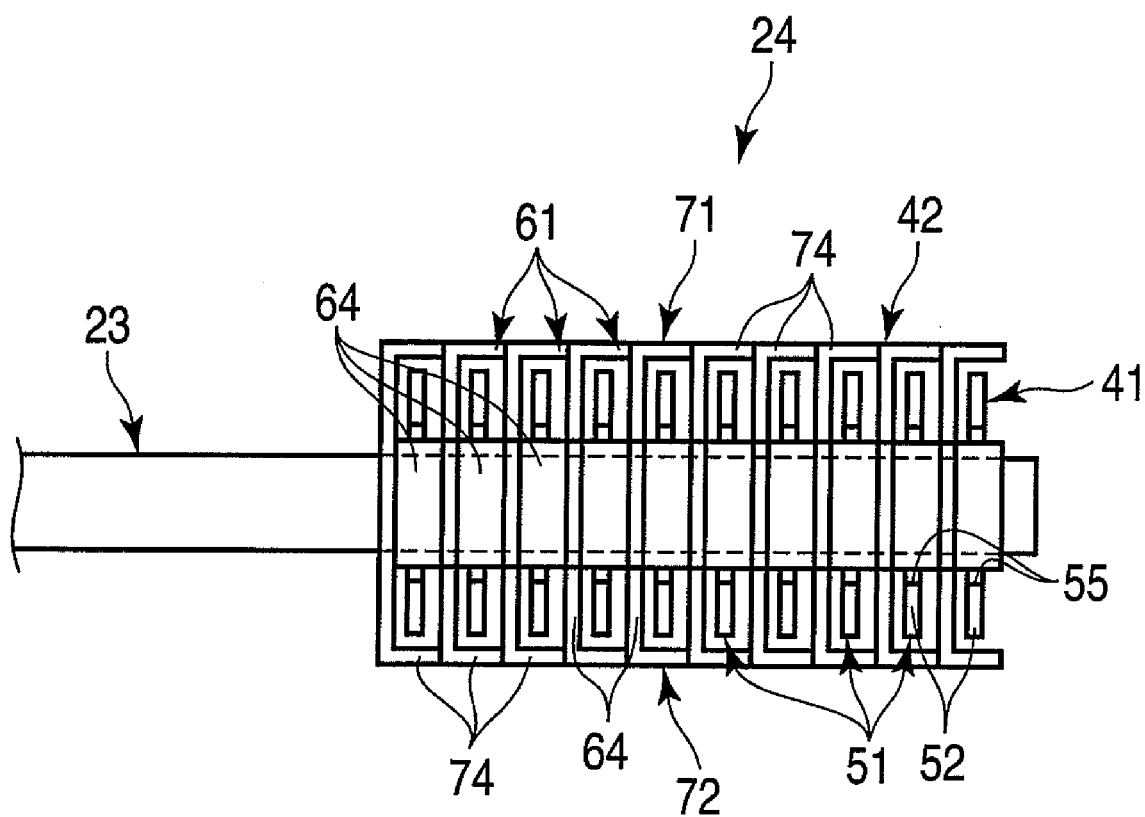
FIG. 22 is an exemplary front view showing a modification example of the heat sink according to the embodiment of the invention.

Further, in place of the above, as shown in FIG. 22, bent sections 74 may be provided at both the upper and lower end parts of each fin of the heat sink of one of the first and second fin units 41 and 42, and fins of the other fin unit may be formed into a plate-like shape to be inserted between the above fins. The cooling fan 21 is not always a necessary component. The first and second fin units 41 and 42 may be cooled by natural air-cooling.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic apparatus comprising:
a housing;
a first exothermic component in the housing;
a heat pipe thermally connected to the first exothermic component; and
a heat sink in the housing penetrated by the heat pipe, wherein
the heat sink comprises a first fin structure and a second fin structure,
the first fin structure comprises a plurality of fins located at intervals, and the fins of the first fin structure comprise a through-hole in which the heat pipe is inserted and a caulking margin portion extending from an edge portion of the through-hole along a circumferential surface of the heat pipe and fixed to the heat pipe,
the second fin structure comprises a plurality of fins located at intervals,
the fins of the second fin structure are located in spaces between the fins of the first fin structure, and configured to overlap the heat pipe in the first fin structure, and
the fins of the second fin structure comprise a cutout portion configured to allow the heat pipe through, the cutout portion of the fins of the second fin structure is larger than the outer shape of the caulking margin portion of the fins of the first fin structure, and the fins of the second fin structure are configured to overlap with the caulking margin portions of the fins of the first fin structure.

2. The electronic apparatus of claim 1, further comprising:
a second exothermic component in the first housing like the exothermic component; and
a second heat pipe thermally connected to the second exothermic component, wherein the second heat pipe is configured to penetrate the heat sink like the heat pipe,
the fins of the second fin structure in the housing respectively comprise a second through-hole in which the second heat pipe is inserted, and a second caulking margin portion extending from an edge portion of the second through-hole along a circumferential surface of the second heat pipe and configured to be fixed to the second heat pipe.

3. The electronic apparatus of claim 2, wherein
the fins of the first fin structure comprise a second cutout portion configured to allow the second heat pipe through, and the fins of the first fin structure are configured to overlap the second heat pipe in the second fin structure.

4. The electronic apparatus of claim 3, comprising:
a first allowance space between the caulking margin portion of the fins of the first fin structure and the cutout portion of the fins of the second fin structure; and
a second allowance space between the caulking margin portion of the fins of the second fin structure and the cutout portion of the fins of the first fin structure,
wherein the first fin structure is configured to change a location with respect to the second fin structure.

5. The electronic apparatus of claim 4, wherein
an interval of the fins of the second fin structure is substantially equal to an interval of the fins of the first fin structure.

6. The electronic apparatus of claim 4, wherein
when the first fin structure thermally connected to the first exothermic component is configured to generate a smaller amount of heat, the fins of the first fin structure are located with a larger interval than an interval of the fins of the second fin structure connected to the second exothermic component configured to generate a larger amount of heat, and when the second fin structure thermally connected to the second exothermic component is configured to generate a smaller amount of heat, the fins of the second fin structure are located with a larger interval than an interval of the fins of the first fin structure connected to the first exothermic component configured to generate a larger amount of heat.

7. The electronic apparatus of claim 1, further comprising:
a second heat pipe thermally connected to the exothermic component like the heat pipe, wherein
the fins of the second fin structure respectively comprise a second through-hole in which the second heat pipe is inserted, and a second caulking margin portion extending from an edge portion of the second through-hole along a circumferential surface of the second heat pipe and fixed to the second heat pipe.

8. The electronic apparatus of claim 1, wherein
the first fin structure is on a first end portion of the heat pipe,
the second fin structure is on a second end portion of the heat pipe, and
the heat pipe is bent in such a manner that the first fin structure and the second fin structure are combined with each other and configured to face each other.

* * * * *